(12) United States Patent
Thomson et al.

(10) Patent No.: US 10,636,482 B2
(45) Date of Patent: *Apr. 28, 2020

(54) METHODS OF OPERATING A MEMORY WITH REDISTRIBUTION OF RECEIVED DATA

(71) Applicant: MICRON TECHNOLOGY, INC., Boise, ID (US)

(72) Inventors: Preston A. Thomson, Boise, ID (US); Peiling Zhang, El Dorado Hills, CA (US); Junchao Chen, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/361,313

(22) Filed: Mar. 22, 2019

(65) Prior Publication Data

US 2019/0221258 A1 Jul. 18, 2019

Related U.S. Application Data

(63) Continuation of application No. 15/993,968, filed on May 31, 2018, now Pat. No. 10,283,195, which is a (Continued)

(30) Foreign Application Priority Data

Jul. 13, 2016 (SG) .............................. 10201605746

(51) Int. Cl.
*G11C 11/56* (2006.01)
*G11C 16/10* (2006.01)
*G11C 16/04* (2006.01)

(52) U.S. Cl.
CPC ...... *G11C 11/5628* (2013.01); *G11C 11/5635* (2013.01); *G11C 11/5642* (2013.01); *G11C 16/0458* (2013.01); *G11C 16/0483* (2013.01); *G11C 16/10* (2013.01); *G11C 2211/5641* (2013.01); *G11C 2211/5648* (2013.01)

(58) Field of Classification Search
None
See application file for complete search history.

(56) References Cited

U.S. PATENT DOCUMENTS 7,986,552 B2 7/2011 Shin et al.
8,059,455 B2 11/2011 Stern et al.
(Continued)

*Primary Examiner* — Tan T. Nguyen
(74) *Attorney, Agent, or Firm* — Dicke, Billig & Czaja, PLLC

(57) ABSTRACT

Methods of operating a memory include receiving a plurality of digits of data for programming to a plurality of memory cells of the memory, redistributing the received plurality of digits of data in a reversible manner to generate a plurality of digits of redistributed data each corresponding to a respective memory cell of the plurality of memory cells, and for each memory cell of the plurality of memory cells, programming the corresponding digit of redistributed data for that memory cell to a first digit position of a respective data state of that memory cell, programming a second digit of data having a first data value to a second digit position of the respective data state of that memory cell, and programming a third digit of data having a second data value to a third digit position of the respective data state of that memory cell.

20 Claims, 9 Drawing Sheets

Related U.S. Application Data continuation of application No. 15/490,316, filed on Apr. 18, 2017, now Pat. No. 10,014,051.

(56) References Cited

U.S. PATENT DOCUMENTS

| | | |
|---|---|---|
| 8,154,918 B2 | 4/2012 | Sharon et al. |
| 8,230,158 B2 | 7/2012 | Ruby et al. |
| 9,013,919 B2 | 4/2015 | Avila et al. |
| 10,014,051 B2 * | 7/2018 | Thomson ............ G11C 11/5628 |
| 10,283,195 B2 * | 5/2019 | Thomson ............ G11C 11/5628 |
| 2009/0067244 A1 * | 3/2009 | Li ..................... G11C 7/1006 |
| | | 365/185.12 |
| 2012/0215963 A1 | 8/2012 | Kim et al. |
| 2012/0239861 A1 | 9/2012 | Lee et al. |
| 2013/0124784 A1 | 5/2013 | Woo et al. |
| 2014/0010017 A1 | 1/2014 | Lee et al. |
| 2014/0043898 A1 | 2/2014 | Kuo et al. |
| 2014/0108747 A1 | 4/2014 | Seol et al. |
| 2014/0115234 A1 | 4/2014 | Woo et al. |
| 2014/0313835 A1 | 10/2014 | Lee et al. |
| 2015/0228344 A1 | 8/2015 | Park |
| 2015/0262694 A1 | 9/2015 | Seo et al. |
| 2016/0148703 A1 | 5/2016 | Kim et al. |
| 2016/0188820 A1 | 6/2016 | Brown et al. |
| 2017/0068481 A1 | 3/2017 | Yoo |

* cited by examiner

|  | Even Page | | Odd Page | |
| --- | --- | --- | --- | --- |
|  | Lower Page | Upper Page | Lower Page | Upper Page |
| WL1 | 2 (SLC) | | 3 (SLC) | |
| WL2 | 0 | 6 | 1 | 7 |
| WL3 | 4 | 10 | 5 | 11 |
| WL4 | 8 | 14 | 9 | 15 |
| WL5 | 12 | 18 | 13 | 19 |
| ... | ... | ... | ... | ... |
| WL62 | 240 | 246 | 241 | 247 |
| WL63 | 244 | 250 | 245 | 251 |
| WL64 | 248 (SLC) | | 249 (SLC) | |
| WL65 | 252 (SLC) | | 253 (SLC) | |
| WL66 | 254 (SLC) | | 255 (SLC) | |

METHODS OF OPERATING A MEMORY WITH REDISTRIBUTION OF RECEIVED DATA

RELATED APPLICATIONS

This Application is a Continuation of U.S. application Ser. No. 15/993,968, titled "METHODS OF OPERATING A MEMORY WITH REDISTRIBUTION OF RECEIVED DATA," filed May 31, 2018, now U.S. Pat. No. 10,283,195, issued on May 7, 2019, which is a Continuation of U.S. application Ser. No. 15/490,316, titled "DATA STORAGE WITH DATA RANDOMIZER IN MULTIPLE OPERATING MODES," filed Apr. 18, 2017, now U.S. Pat. No. 10,014,051, issued on Jul. 3, 2018, which are commonly assigned and incorporated herein by reference. This Application further claims priority to Singapore Patent Application No. 10201605746R, filed Jul. 13, 2016.

TECHNICAL FIELD

The present disclosure relates generally to memory and, in particular, in one or more embodiments, the present disclosure relates to apparatus and methods for storing data with a data randomizer in multiple modes.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). An MLC uses more than two Vt ranges, where each Vt range indicates a different data state. Multiple-level cells can take advantage of the analog nature of a traditional charge storage cell by assigning a bit pattern to a specific Vt range. While MLC typically uses a memory cell to represent one data state of a binary number of data states (e.g., 4, 8, 16, . . .), a memory cell operated as MLC may be used to represent a non-binary number of data states. For example, where the MLC uses three Vt ranges, two memory cells might be used to collectively represent one of eight data states.

In programming MLC memory, data values are typically programmed one digit at a time. For example, in four-level MLC, a first digit, e.g., a least significant bit (LSB), often referred to as lower page (LP) data, may be programmed into the memory cells, thus resulting in two (e.g., first and second) threshold voltage ranges. Subsequently, a second digit, e.g., a most significant bit (MSB), often referred to as upper page (UP) data may be programmed into the memory cells, typically moving some portion of those memory cells in the first threshold voltage range into a third threshold voltage range, and moving some portion of those memory cells in the second threshold voltage range into a fourth threshold voltage range. Similarly, eight-level MLC may represent a bit pattern of three bits, including a first digit, e.g., a least significant bit (LSB) or LP data, a second digit, e.g., middle page (MP) data, and a third digit, e.g., a most significant bit (MSB) or UP data. In operating eight-level MLC, the LP data may be first programmed to the memory cells, followed by the MP data, then followed by the UP data.

In general, there is a continuing desire to provide increasing levels of memory density. One approach to increasing memory density is to program memory cells as MLC, and to increase the number of levels to which the memory cells are programmed, thus increasing the number of data states that can be represented by a single memory cell. This typically results in the margins between Vt ranges of adjacent data states becoming more narrow, which can lead to difficulties in accurately determining (e.g., reading) the data state of a memory cell.

BRIEF DESCRIPTION OF THE DRAWINGS

FIG. 4 is a chart depicting a programming sequence for a programming operation on portion of an array of memory cells in accordance with an embodiment.

DETAILED DESCRIPTION

Figure 1:
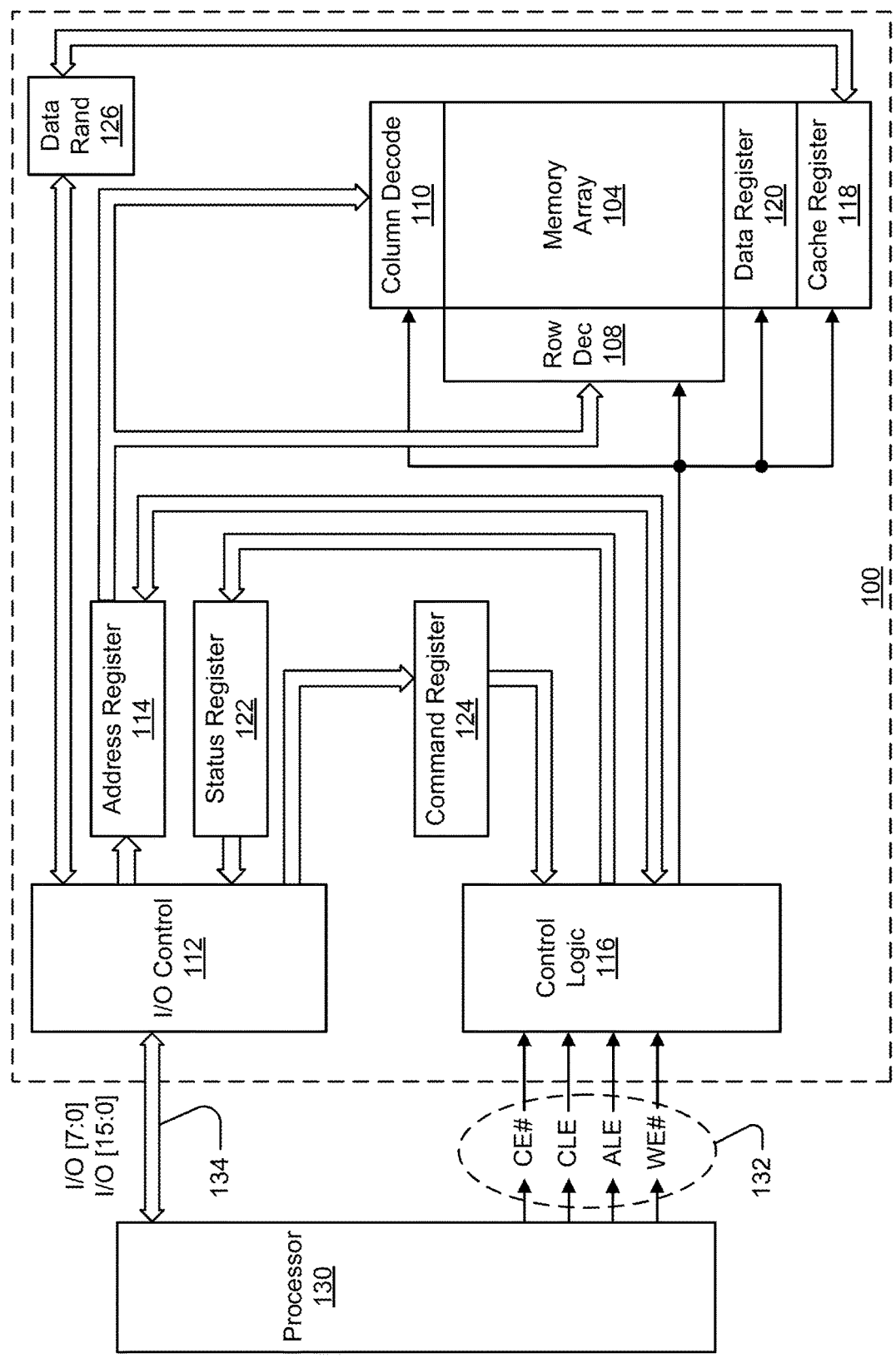
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory device 100 (e.g., an internal controller of memory device 100) may be configured to perform methods of operating memory described herein.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations (e.g., erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

A data randomizer 126 may selectively encode incoming data from the I/O control circuitry 112 prior to passing the encoded data to the cache register 118 for a programming operation, and may selectively decode data received from the cache register 118 prior to passing the decoded data to the I/O control circuitry 112. The data randomizer 126 is configured to change original data to encoded data, during a programming operation, such that it is stored in a pattern that is different than a pattern in which the original data would have been stored, and to restore the encoded data to the original data during a read operation. In general, some function may be used to encode the original data, and the inverse of that function might be used to decode the encoded data to restore the original data. While generally referred to as a data randomizer in the art, it is recognized that the data is not truly randomized in a mathematical sense. Instead, randomization as used herein refers to a redistribution of data values in a reversible manner.

Data randomization is often used to mitigate coupling effects between closely neighboring memory cells that can disturb the intended data states. For example, a particular memory cell of a string of series-connected memory cells might have two neighboring memory cells in the same string of series-connected memory cells and connected to immediately adjacent access lines, and two neighboring memory cells connected to a same access line in immediately adjacent strings of series-connected memory cells. Where those four neighboring memory cells are each programmed to a highest data states for those memory cells, the coupling effect of the charge stored to those neighboring memory cells on the particular memory cell may pull the effective threshold voltage of the particular memory cell into a range representing a different (e.g., higher) data state. Data randomization might be used to reduce the chances of encountering such a situation. When the data randomizer 126 is in one mode of operation, e.g., enabled, there is generally no direct control as to what data state a memory cell might be programmed. When the data randomizer 126 is in another mode of operation, e.g., disabled, a memory cell can be programmed to any particular data state through appropriate selection of data values.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
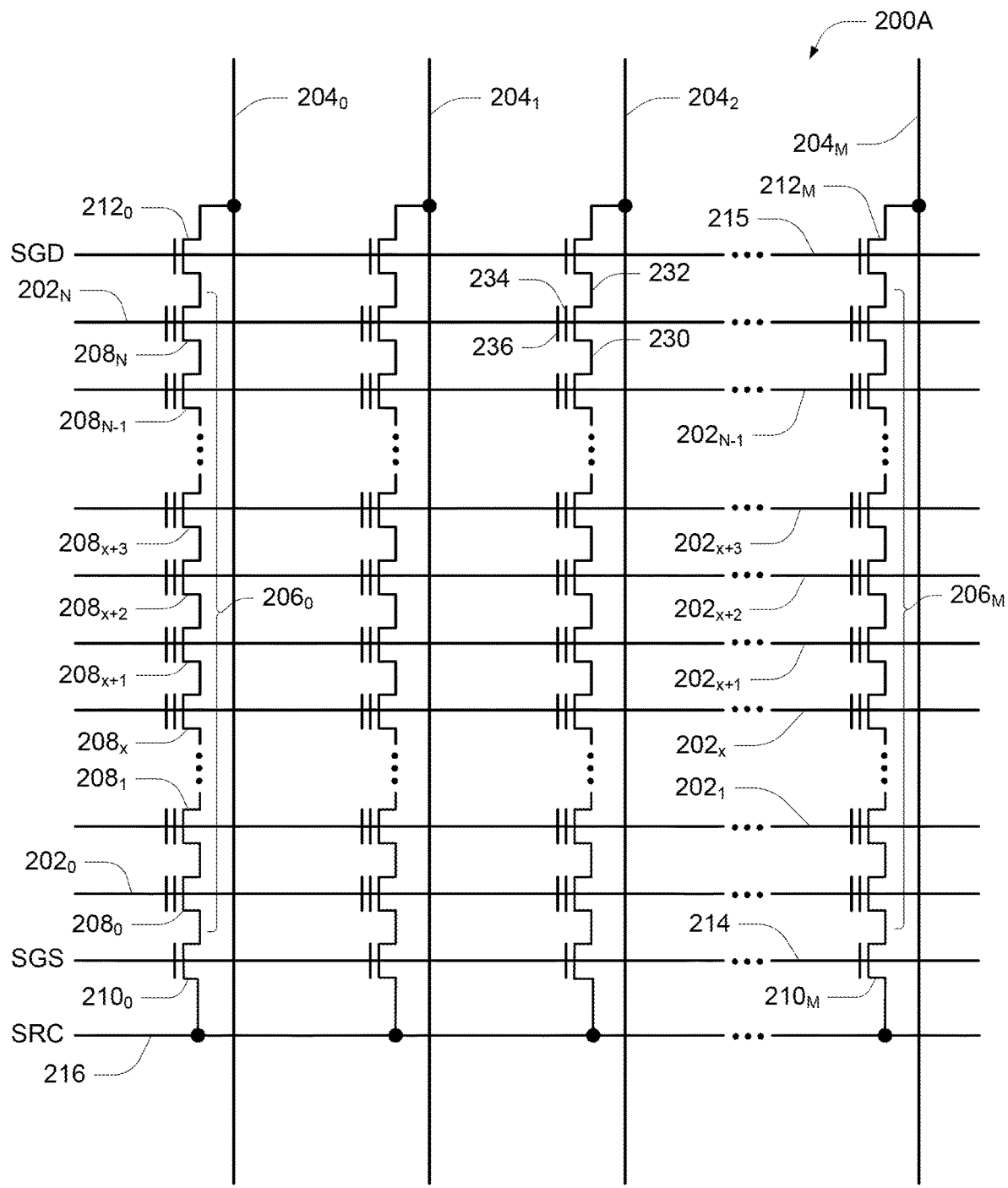
FIG. 2A is a schematic of a portion of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly connected to a select line 214, such as a source select line, and select transistors $212_0$ to $212_M$ might be commonly connected to a select line 215, such as a drain select line.

A source of each select transistor 210 might be connected to common source 216. The drain of each select transistor 210 might be connected to a memory cell $208_0$ of the corresponding NAND string 206. For example, the drain of select transistor $210_0$ might be connected to memory cell $208_0$ of the corresponding NAND string $206_0$. Therefore, each select transistor 210 might be configured to selectively connect a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to a memory cell $208_N$ of the corresponding NAND string 206. For example, the source of select transistor $212_0$ might be connected to memory cell $208_N$ of the corresponding NAND string $206_0$. Therefore, each select transistor 212 might be configured to selectively connect a corresponding NAND string 206 to a corresponding bit line 204. A control gate of each select transistor 212 might be connected to select line 215.

The memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. In some cases, memory cells 208 may further have a defined source 230 and a defined drain 232. Memory cells 208 have their control gates 236 connected to (and in some cases form) a word line 202.

A column of the memory cells 208 is a NAND string 206 or a plurality of NAND strings 206 selectively connected to a given bit line 204. A row of the memory cells 208 may be memory cells 208 commonly connected to a given word line 202. A row of memory cells 208 can, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page. The portion of a physical page (which, in some embodiments, could still be the entire row) that is read during a single read operation or programmed during a programming operation (e.g., an upper or lower page memory cells) might be deemed a logical page. A block of memory cells may include those memory cells that are configured to be erased together, such as all memory cells connected to word lines $202_0$-$202_N$ (e.g., all NAND strings 206 sharing common word lines 202).

Figure 2B:
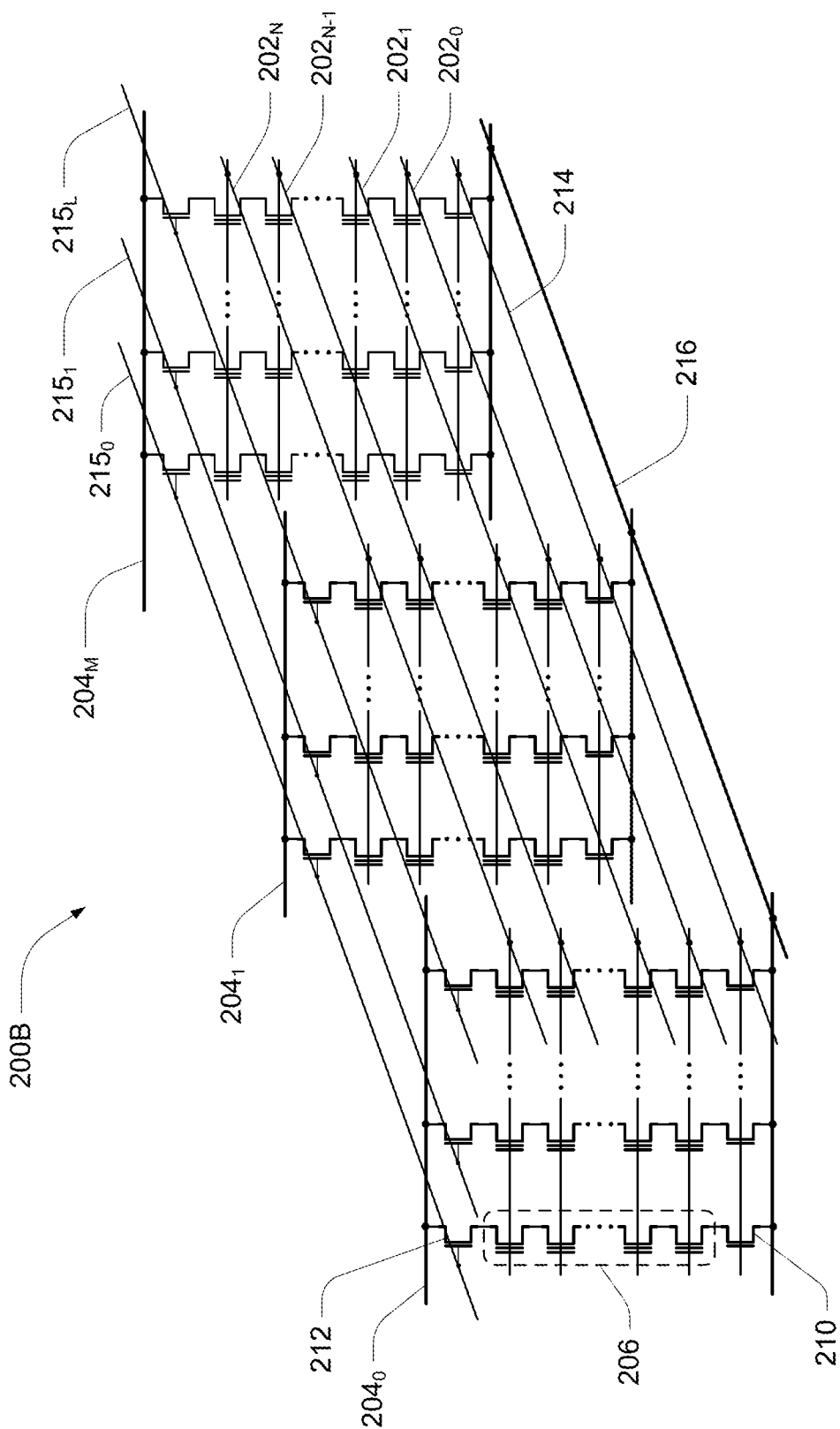
FIG. 2B is another schematic of a portion of an array of memory cells as could be used in a memory of the type described with reference to FIG. 1.

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
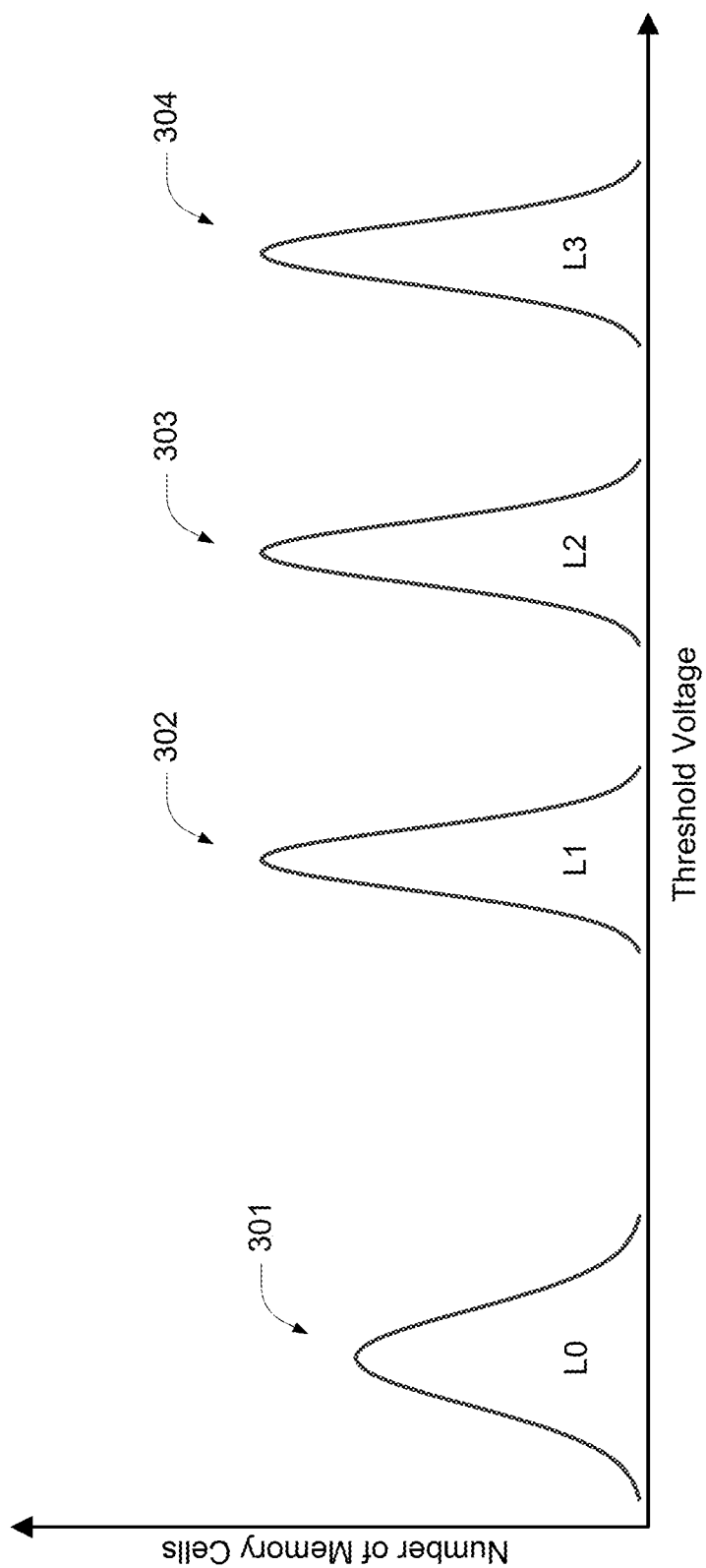
FIG. 3A illustrates an example of threshold voltage ranges for a population of multi-level memory cells as could be used with embodiments.

FIG. 3A illustrates an example of threshold voltage ranges for a population of a four-level (e.g., two-bit) MLC memory cells. For example, such a memory cell might be programmed to a threshold voltage (Vt) that falls within one of four different threshold voltage ranges 301-304, each being used to represent a data state corresponding to a bit pattern comprised of two bits. The threshold voltage range 301 typically has a greater width than the remaining threshold voltage ranges 302-304 as memory cells are generally all placed in the data state corresponding to the threshold voltage range 301, then subsets of those memory cells are subsequently programmed to have threshold voltages in one of the threshold voltage ranges 302-304. As programming operations are generally more incrementally controlled than erase operations, these threshold voltage ranges 302-304 may tend to have tighter distributions.

The threshold voltage ranges 301, 302, 303, and 304 might each represent a respective data state, e.g., L0, L1, L2, and L3, respectively. As an example, if the threshold voltage of a memory cell is within the first of the four threshold voltage ranges 301, the memory cell in this case may be storing a logical '11' data state and is typically referred to as the erased state of the memory cell. If the threshold voltage is within the second of the four threshold voltage ranges 302, the memory cell in this case may be storing a logical '01' data state. If the threshold voltage is within the third of the four threshold voltage ranges 303, the memory cell in this case may be storing a logical '00' data state. And if the threshold voltage is within the fourth of the four threshold voltage ranges 304, the memory cell in this case may be storing a logical '10' data state. Although a specific example of binary representation is provided, embodiments may use other arrangements of bit patterns to represent the various data states.

Figure 3B:
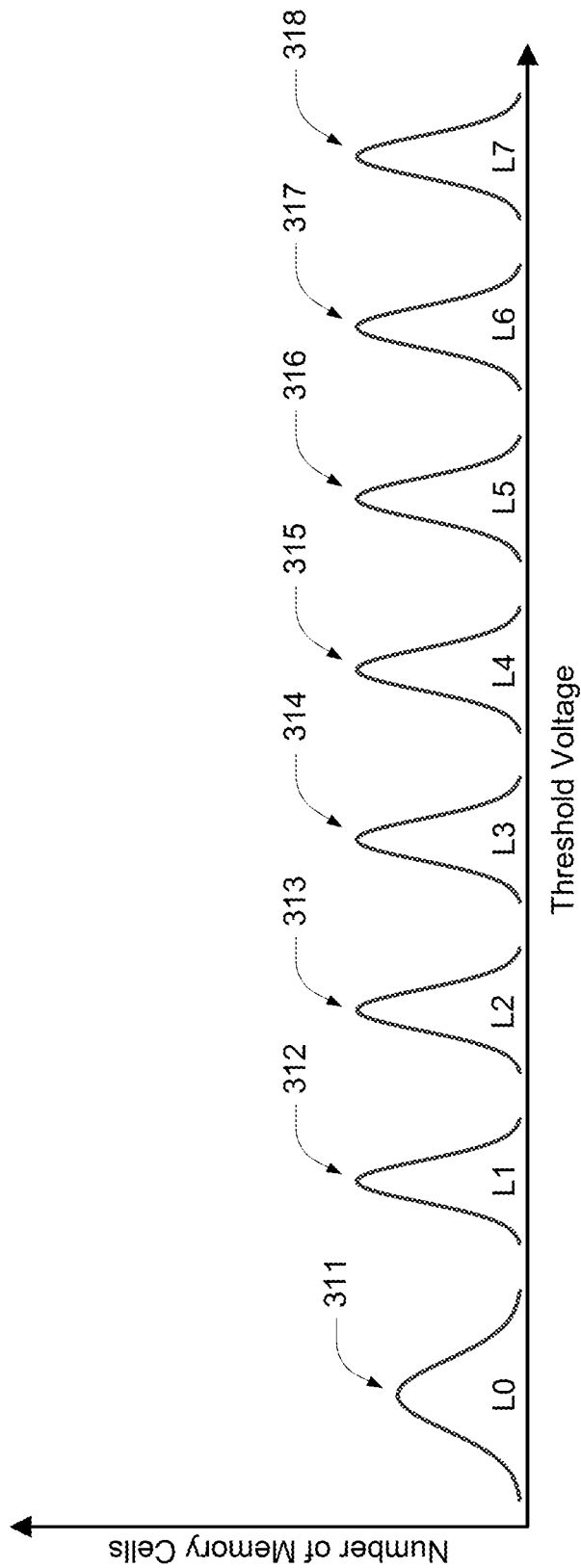
FIG. 3B illustrates another example of threshold voltage ranges for a population of multi-level memory cells as could be used with embodiments.

FIG. 3B illustrates an example of threshold voltage ranges for a population of a eight-level (e.g., three-bit) MLC memory cells. For example, such a memory cell might be programmed to a threshold voltage (Vt) that falls within one of eight different threshold voltage ranges 311-318, each being used to represent a data state corresponding to a bit pattern comprised of three bits. The threshold voltage range 311 typically has a greater width than the remaining threshold voltage ranges 312-318 as memory cells are generally all placed in the data state corresponding to the threshold voltage range 311, then subsets of those memory cells are subsequently programmed to have threshold voltages in one of the threshold voltage ranges 312-318. As programming operations are generally more incrementally controlled than erase operations, these threshold voltage ranges 312-318 may tend to have tighter distributions.

The threshold voltage ranges 311, 312, 313, 314, 315, 316, 317, and 318 might each represent a respective data state, e.g., L0, L1, L2, L3, L4, L5, L6, and L7, respectively. As an example, if the threshold voltage of a memory cell is within the first of the eight threshold voltage ranges 311, the memory cell in this case may be storing a logical '111' data state and is typically referred to as the erased state of the memory cell. If the threshold voltage is within the second of the eight threshold voltage ranges 312, the memory cell in this case may be storing a logical '011' data state. If the threshold voltage is within the third of the eight threshold voltage ranges 313, the memory cell in this case may be storing a logical '001' data state.

If the threshold voltage is within the fourth of the eight threshold voltage ranges 314, the memory cell in this case may be storing a logical '101' data state. If the threshold voltage is within the fifth of the eight threshold voltage ranges 315, the memory cell in this case may be storing a logical '100' data state. If the threshold voltage is within the sixth of the eight threshold voltage ranges 316, the memory cell in this case may be storing a logical '000' data state. If the threshold voltage is within the seventh of the eight threshold voltage ranges 317, the memory cell in this case may be storing a logical '010' data state. And if the threshold voltage is within the eighth of the eight threshold voltage ranges 318, the memory cell in this case may be storing a logical '110' data state.

In some cases, a portion of the array of memory cells of a memory might be pre-programmed with data prior to connecting that memory to other circuitry, e.g., such as connecting the memory device 100 to the processor 130 as depicted in FIG. 1. Connecting a memory to other circuitry may cause thermal stress to the memory. For example, where reflow soldering techniques are used to connect a memory die to a circuit board, the circuit board and memory would be subjected to high levels of heat in order to melt, i.e., reflow, the solder joints to make the desired connections. Thermal stress may cause changes in the threshold voltages of the memory cells of the array, which may result in widening of the threshold voltage ranges of the memory cells representing the various data states. Where those threshold voltage ranges widen too much, a memory cell may indicate a data state other than its intended data state. This can cause read errors for an end-user.

One method to improve reliability of such pre-programmed data in MLC memory is to utilize fewer than the intended number of data states for memory cells storing that data. For example, memory cells of a four-level MLC might be operated as SLC memory. Although reducing the memory density for these memory cells, this method improves the read margins over four-level MLC while maintaining the ability to gain the benefits of data randomization.

Another method to improve reliability might be to utilize a method of storage often referred to as L0/L3 padding, which programs a memory cell to either the L0 data state to represent one data value (e.g., a logical 1) or the L3 data state to represent a different data value (e.g., a logical 0). Such padding can provide further margin between data states than operating the memory cell as standard SLC. This might be accomplished by disabling the data randomizer and providing the data value "11" to a memory cell to program it to the L0 data state to represent one data value (e.g., a logical 1), and providing the data value "10" to the memory cell to program it to the L3 data state to represent a different data value (e.g., a logical 0). To read this data, the data randomizer is again disabled so the sensed L0 and L3 data states can be correctly interpreted as representing the logical 1 and logical 0 data values, respectively, for the foregoing example.

Although disabling the data randomizer permits the assignment of the data between the two data states at the extremes (e.g., a lowest and highest threshold voltage range) of the multiple threshold voltage ranges, and thus provides additional margin over standard SLC, the advantages of data randomization are lost. Similarly, where the pre-programmed data is provided for a boot sequence, the memory would generally have to be configured to recognize the need to disable the data randomizer when reading the pre-programmed data and to enable the data randomizer for reading other data. Various embodiments facilitate retention of advantages of data randomization, while permitting reading of the data without disabling the data randomizer.

Various embodiments selectively change modes of a data randomizer at the time of programming the data to individual memory cells. For example, in four-level MLC operation, such as described with reference to FIG. 3A, the L0 and L3 data states represent data values "11" and "10," respectively, where the left-most digit of the bit patterns might represent a most significant bit (MSB) and the right-most digit of the bit patterns might represent a least significant bit (LSB). See Table 1. Note that these data states have different data values for a particular digit position of the two-bit patterns, e.g., the LSB or LP data, and share a common value for a different digit position of the two-bit patterns, e.g., the MSB or UP data. Accordingly, in this example, the LP data may be programmed to memory cells using standard MLC programming techniques while the data randomizer is enabled, thus providing benefits of data randomization. By subsequently programming the UP data to the memory cells using the same MLC programming techniques while the data randomizer is disabled, the LP data may be allocated solely to the L0 and L3 data states, thus further providing the read margin improvements over standard SLC operation.

TABLE 1

Data State Values for Four-Level MLC

| Vt Range | Digit Position | |
|---|---|---|
| | 1 (UP) | 0 (LP) |
| 301 (L0) | 1 | 1 |
| 302 (L1) | 0 | 1 |
| 303 (L2) | 0 | 0 |
| 304 (L3) | 1 | 0 |

FIG. 4 is a chart depicting a programming sequence for a programming operation on portion of an array of memory cells in accordance with an embodiment, including strings of series-connected memory cells connected to a common set of access lines, e.g., WL1-WL66. As depicted in FIG. 4, the Even Page may correspond to the memory cells of some subset of strings of series-connected memory cells of the array of memory cells, e.g., even numbered strings of series-connected memory cells of a block of memory cells, while the Odd Page may correspond to the memory cells of some other subset of strings of series-connected memory cells of the array of memory cells, e.g., odd numbered strings of series-connected memory cells of the block of memory cells. The Lower Page may correspond to one portion of a data state, e.g., the LSB, of a memory cell of a string of series-connected memory cells of its corresponding Even Page or Odd Page, while the Upper Page may correspond to a different (e.g., remaining) portion of the data state, e.g., the MSB, of a memory cell of a string of series-connected memory cells of its corresponding Even Page or Odd Page. As indicated in FIG. 4, some memory cells, e.g., those connected to access lines WL1 and WL64-WL66, might be operated as SLC while remaining access lines WL2-WL63 might be operated as MLC. The operation of memory cells at ends of the strings of series-connected memory cells as SLC is often implemented due to differing operational characteristics of these memory cells that may result from operation of the select transistors or otherwise.

In the example of FIG. 4, page 0 would be programmed to the Lower Page of the memory cells connected to access line WL2 of the strings of series-connected memory cells of the Even Page, e.g., with memory cells connected to access line WL2 selected for programming, and all memory cells connected to remaining access lines WL2-WL66 unselected for programming. Following programming of page 0, page 1 would be programmed to the Lower Page of the memory cells connected to access line WL2 of the strings of series-connected memory cells of the Odd Page. Following programming of page 1, page 2 would be programmed to the memory cells connected to access line WL1 of the strings of series-connected memory cells of the Even Page. Following programming of page 2, page 3 would be programmed to the memory cells connected to access line WL1 of the strings of series-connected memory cells of the Odd Page. Following the programming of page 3, page 4 would be programmed to the Lower Page of the memory cells connected to access line WL3 of the strings of series-connected memory cells of the Even Page, then page 5 would be programmed to the Lower Page of the memory cells connected to access line WL3 of the strings of series-connected memory cells of the Odd Page. Following the programming of page 5, page 6 would be programmed to the Upper Page of the memory cells connected to access line WL2 of the strings of series-connected memory cells of the Even Page, then page 7 would be programmed to the Upper Page of the memory cells connected to access line WL2 of the strings of series-connected memory cells of the Odd Page. The programming sequence might then proceed sequentially for remaining pages 8-255 in a similar manner as indicated in FIG. 4.

With reference to FIG. 4, consider a case where eight pages of data are with L0/L3 padding implemented on the memory cells operated as MLC. In this example, they might be programmed to pages 0, 1, 2, 3, 4, 5, 8, and 9 with the data randomizer enabled. To implement L0/L3 padding on the pages 0, 1, 4, 5, 8, and 9 in accordance with embodiments, the data randomizer would be disabled for pages 6, 7, 10, 11, 14, and 15, and data configured to place or maintain the threshold voltage ranges in the two desired ranges is programmed to those pages. Programming of remaining pages 12, 13, and 16-255 may be performed with the data randomizer enabled. Furthermore, reading of all pages may be performed with the data randomizer enabled, with data read from pages 6, 7, 10, 11, 14, and 15 either ignored as invalid, or simply not read.

Figure 5A:
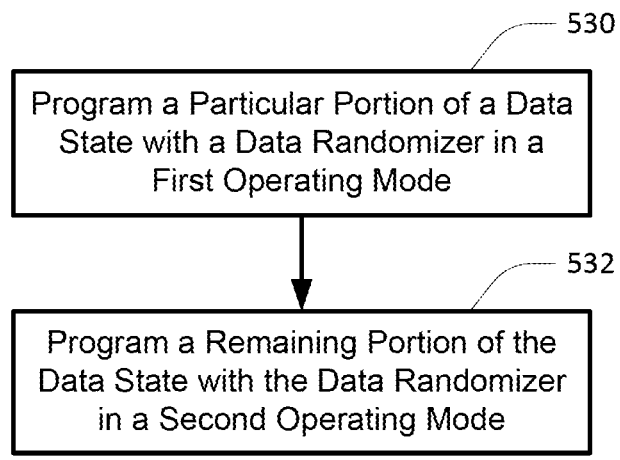
FIG. 5A is a flowchart of a method of operating a memory in accordance with an embodiment.

FIG. 5A is a flowchart of a method of operating a memory in accordance with an embodiment. At 530, a particular portion of a data state is programmed to a memory cell with a data randomizer in a first operating mode. The particular portion of the data state may be programmed with user data, e.g., data intended for use by a user of the memory, whether that user be a person, a processor, or some other device with access to data stored in the memory. At 532, a remaining portion of the data state is programmed to the memory cell with the data randomizer in a second operating mode. The remaining portion of the data state may be programmed with uniform data, e.g., data that has a particular value (e.g., a logical 1) regardless of the data programmed to the particular portion of the data state. For example, a first portion of the data state might be programmed with the data randomizer enabled and the remaining portion of the data state might be programmed with the data randomizer disabled. Such operation might facilitate reading the memory cell with the data randomizer enabled to determine the data value of the first portion of the data state, and might further facilitate using only the lowest and highest threshold voltage ranges used to represent the possible data states for the memory cell.

As a further example, the particular portion of the data state might be LP data of a four-level MLC and the remaining portion of the data state might be UP data of the four-level MLC. Table 2 and FIG. 3B provide a still further example, specifically with reference to an eight-level (e.g., three digit) MLC. For example, the particular portion of the data state might be LP data of the eight-level MLC and the remaining portion of the data state might be the middle page (MP) data and the UP data of the eight-level MLC. As can be seen in Table 2, programming logical 1s for the MP and UP data with the data randomizer disabled would facilitate the use of the threshold voltage ranges corresponding to data states L0 and L7.

TABLE 2

Data State Values for Eight-Level MLC

| Vt Range | Digit Position | | |
|---|---|---|---|
| | 2 (UP) | 1 (MP) | 0 (LP) |
| 311 (L0) | 1 | 1 | 1 |
| 312 (L1) | 0 | 1 | 1 |
| 313 (L2) | 0 | 0 | 1 |
| 314 (L3) | 1 | 0 | 1 |
| 315 (L4) | 1 | 0 | 0 |
| 316 (L5) | 0 | 0 | 0 |
| 317 (L6) | 0 | 1 | 0 |
| 318 (L7) | 1 | 1 | 0 |

Figure 5B:
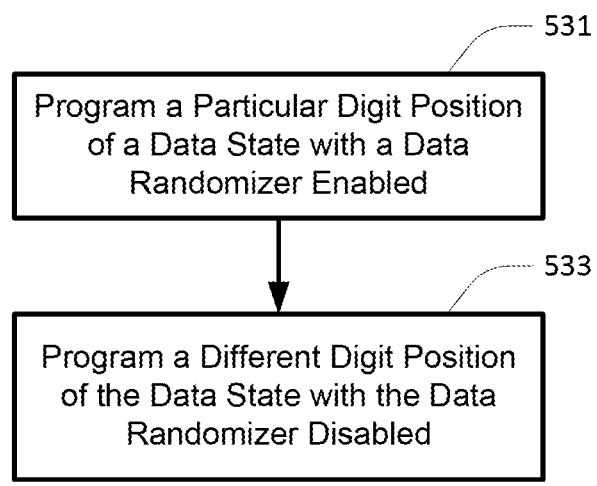
FIG. 5B is a flowchart of a method of operating a memory in accordance with a particular example of the method of FIG. 5A.

FIG. 5B is a flowchart of a method of operating a memory in accordance with a particular example of the method of FIG. 5A. At 531, a particular digit position of a data state is programmed to a memory cell with a data randomizer enabled. At 533, a different digit of the data state is programmed to the memory cell with the data randomizer disabled. With reference back to Table 1, the digit position 0 might be programmed to a memory cell with the data randomizer enabled at 531, and the digit position 1 might be programmed to the memory cell with the data randomizer disabled at 533. Similarly, with reference back to Table 2, the digit position 0 might be programmed to a memory cell with the data randomizer enabled at 531, and the digit position 1 might be programmed to the memory cell with the data randomizer disabled at 533. In addition, 533 might be repeated and the digit position 2 might be programmed to the memory cell with the data randomizer disabled. Note that while examples described herein have utilized data states corresponding to threshold voltage ranges at the extremes of the available threshold voltage ranges, other data states could be utilized. For example, with reference to Table 2, the L1 and L6 data states could be utilized by programming user data for the digit position 0 to a memory cell with the data randomizer enabled at 531, programming a logical 1 for the digit position 1 to the memory cell with the data randomizer disabled at 533, and programming a logical 0 for the digit position 2 to the memory cell with the data randomizer disabled at 533. As such, the concepts described herein can utilize other sets of data states of an MLC to represent a page of data having increased margin over SLC.

Figure 6:
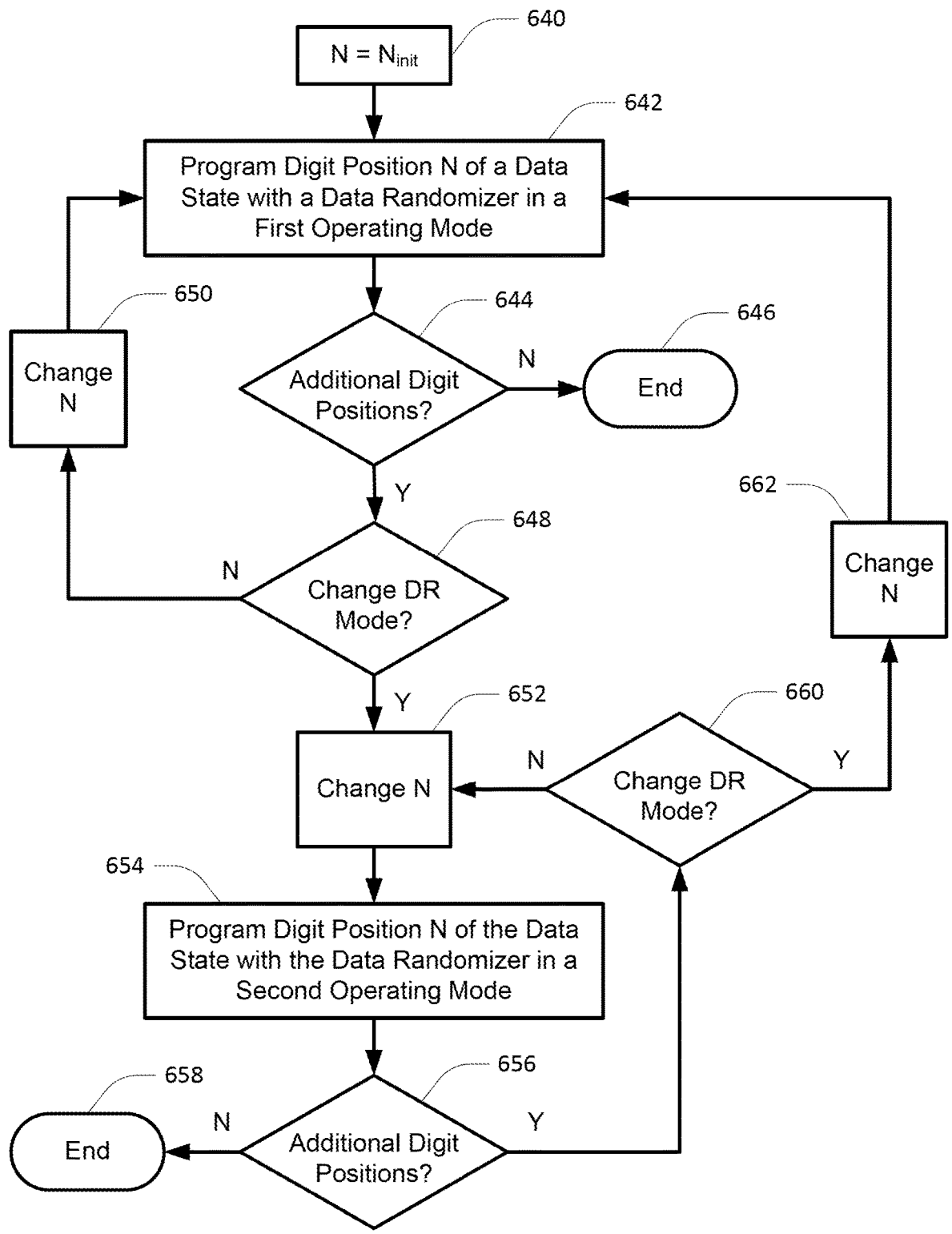
FIG. 6 is a flowchart of a method of operating a memory in accordance with an embodiment.

FIG. 6 is a flowchart of a method of operating a memory in accordance with an embodiment. At 640, a digit position value N is initialized. For example, the digit position N may be initialized to a value of 0. At 642, the digit position N of a data state is programmed to a memory cell with a data randomizer in a first operating mode. The first operating mode might be enabled or the first operating mode might be disabled, for example. At 644, if there are no additional digit positions to be programmed, the process may end at 646. For embodiments, the number of digit positions is greater than or equal to two. When there are additional digit positions to be programmed, a decision is made at 648 whether to change the data randomizer mode. If not, the digit position value N is changed at 650 and the process returns to 642 with the new value of N. For example, where digit positions of a data state are programmed sequentially, the digit positon value N may be incremented or decremented by a value of 1. However, an order of programming digit positions of a data state may proceed other than sequentially, and the value of N could be changed accordingly.

If the data randomizer mode is changed to a second operating mode at 648, the digit position value N is changed at 652. At 654, the digit position N of the data state is programmed to the memory cell with the data randomizer in the second operating mode. For example, where the first operating mode is enabled, the second operating mode may be disabled, and vice versa. At 656, if there are no additional digit positions to be programmed, the process may end at 658. When there are additional digit positions to be programmed at 656, a decision is made at 660 whether to change the data randomizer mode. If not, the digit position value N is changed at 652 and the process returns to 654 with the new value of N. If the data randomizer mode is changed to the first operating mode at 660, the digit position value N is changed at 662 and the process returns to 642 with the new value of N.

Figure 7:
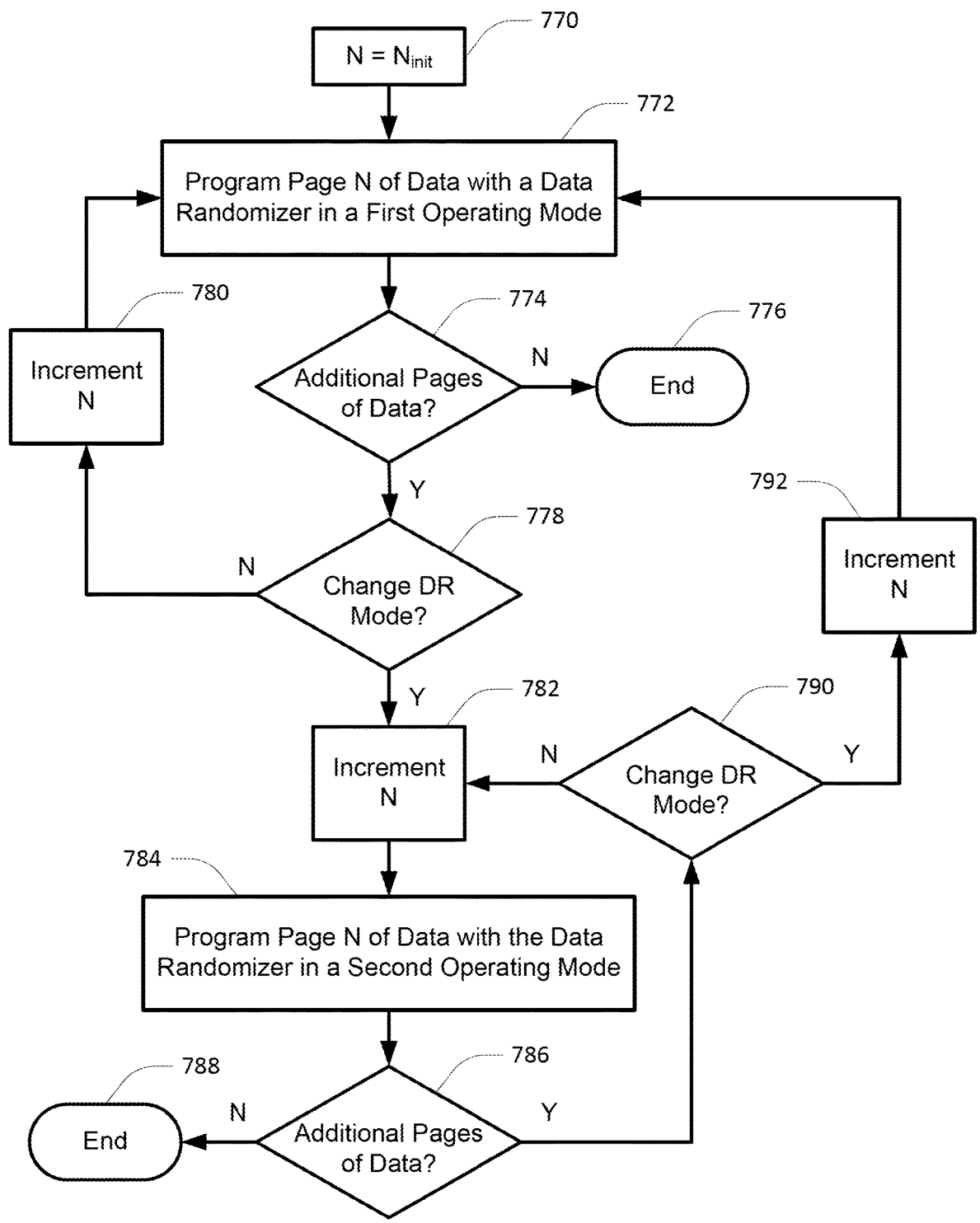
FIG. 7 is a flowchart of a method of operating a memory in accordance with an embodiment.

FIG. 7 is a flowchart of a method of operating a memory in accordance with an embodiment. At 770, a page number value N is initialized. For example, the page number value N may be initialized to a value of 0. At 772, page N of data is programmed with a data randomizer in a first operating mode. The first operating mode might be enabled or the first operating mode might be disabled, for example. At 774, if there are no additional pages of data to be programmed, the process may end at 776. When there are additional pages of data to be programmed, a decision is made at 778 whether to change the data randomizer mode. If not, the page number value N is incremented at 780 and the process returns to 772 with the new value of N. Although the process of FIG. 7 is described as a sequential programming operation, such as described with reference to FIG. 4, values of N may be changed in a manner other than an incremental basis.

If the data randomizer mode is changed to a second operating mode at 778, the page number value N is changed at 782. At 784, page N of the data state is programmed to the memory cell with the data randomizer in the second operating mode. For example, where the first operating mode is enabled, the second operating mode may be disabled, and vice versa. At 786, if there are no additional pages of data to be programmed, the process may end at 788. When there are additional pages of data to be programmed at 786, a decision is made at 790 whether to change the data randomizer mode. If not, the page number value N is incremented at 782 and the process returns to 784 with the new value of N. If the data randomizer mode is changed to the first operating mode at 790, the page number value N is incremented at 792 and the process returns to 772 with the new value of N. It is noted that the method of operating a memory as described with reference to FIG. 7 might correspond to the method of operating a memory as described with reference to FIG. 6, where the method of FIG. 6 is performed concurrently on multiple memory cells, e.g., the memory cells of a page (e.g., Even Page or Odd Page).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
   receiving a plurality of digits of data for programming to a plurality of memory cells of the memory;
   redistributing the received plurality of digits of data in a reversible manner, thereby generating a plurality of digits of redistributed data, wherein each digit of redistributed data of the plurality of digits of redistributed data corresponds to a respective memory cell of the plurality of memory cells; and
   for each memory cell of the plurality of memory cells:
      programming the corresponding digit of redistributed data for that memory cell to a first digit position of a respective data state of that memory cell;
      programming a second digit of data having a first data value to a second digit position of the respective data state of that memory cell; and
      programming a third digit of data having a second data value to a third digit position of the respective data state of that memory cell.

2. The method of claim 1, further comprising:
   for each memory cell of the plurality of memory cells:
      programming a fourth digit of data having a third data value to a fourth digit position of the respective data state of that memory cell.

3. The method of claim 2, wherein, for each memory cell of the plurality of memory cells, programming the second digit of data having the first data value, programming the third digit of data having the second data value, and programming the fourth digit of data having the third data value comprises the first data value, the second data value and the third data value being a same data value.

4. The method of claim 1, wherein, for each memory cell of the plurality of memory cells, programming the corresponding digit of redistributed data for that memory cell to the first digit position of the respective data state of that memory cell comprises programming the corresponding digit of redistributed data for that memory cell to a least significant bit of the respective data state of that memory cell.

5. The method of claim 1, wherein, for each memory cell of the plurality of memory cells, programming the second digit of data having the first data value to the second digit position of the respective data state of that memory cell and programming the third digit of data having the second data value to the third digit position of the respective data state of that memory cell comprises programming that memory cell to one of two pre-selected data states of a plurality of data states regardless of a data value of the corresponding digit of the redistributed data for that memory cell.

6. The method of claim 1, wherein redistributing the received plurality of digits of data in the reversible manner comprises providing the received plurality of digits of data to a data randomizer to generate the plurality of digits of redistributed data.

7. The method of claim 1, wherein redistributing the received plurality of digits of data in the reversible manner comprises encoding the received plurality of digits of data using a particular function.

8. The method of claim 7, further comprising:
   reading each memory cell of the plurality of memory cells after programming the first digit position of the respective data state of each memory cell of the plurality of memory cells, thereby generating read data; and
   decoding the read data using an inverse of the particular function.

9. The method of claim 8, wherein reading each memory cell of the plurality of memory cells comprises reading each digit position of a plurality of digit positions of the respective data state for each memory cell of the plurality of memory cells, and wherein decoding the read data using the inverse of the particular function comprises decoding each digit position of the plurality of digit positions of the respective data state for each memory cell of the plurality of memory cells, wherein the plurality of digit positions of the respective data state for each memory cell of the plurality of memory cells comprises the first digit position, the second digit position and the third digit position for each memory cell of the plurality of memory cells.

10. The method of claim 9, further comprising ignoring, or deeming invalid, each digit position of the plurality of digit positions of the respective data state for any memory cell of the plurality of memory cells that corresponds to any digit position of the respective data state for that memory cell other than the first digit position of the respective data state for that memory cell.

11. The method of claim 9, wherein the plurality of digit positions of the respective data state for each memory cell of the plurality of memory cells further comprises at least one additional digit position for each memory cell of the plurality of memory cells.

12. The method of claim 1, wherein receiving the plurality of digits of data for programming to the plurality of memory cells comprises receiving a page of data for programming to the plurality of memory cells.

13. A method of operating a memory, comprising:
   receiving a plurality of digits of data for programming to a plurality of memory cells of the memory;
   redistributing the received plurality of digits of data in a reversible manner, thereby generating a plurality of digits of redistributed data, wherein each digit of redistributed data of the plurality of digits of redistributed data corresponds to a respective memory cell of the plurality of memory cells;

for each digit of redistributed data of the plurality of digits of redistributed data:
  programming that digit of redistributed data to a first digit position of a respective data state of its corresponding memory cell of the plurality of memory cells;
  programming a second digit of data having a first data value to a second digit position of the respective data state of its corresponding memory cell of the plurality of memory cells;
  programming a third digit of data having a second data value to a third digit position of the respective data state of its corresponding memory cell of the plurality of memory cells; and
  programming a fourth digit of data having a third data value to a fourth digit position of the respective data state of its corresponding memory cell of the plurality of memory cells.

14. The method of claim 13, wherein, for each digit of redistributed data of the plurality of digits of redistributed data, programming the second digit of data having the first data value to the second digit position of the respective data state of the memory cell corresponding to that digit of redistributed data, programming the third digit of data having the second data value to the third digit position of the respective data state of the memory cell corresponding to that digit of redistributed data, and programming the fourth digit of data having the third data value to the fourth digit position of the respective data state of the memory cell corresponding to that digit of redistributed data comprises programming the memory cell corresponding to that digit of redistributed data to one of two pre-selected data states of a plurality of data states regardless of a data value of that digit of redistributed data.

15. The method of claim 13, further comprising:
  reading the first digit position of the respective data state of each memory cell of the plurality of memory cells after programming the first digit position of the respective data state of each memory cell of the plurality of memory cells, thereby generating read data; and
  decoding the read data using an inverse of a function used to redistribute the received plurality of digits of data.

16. The method of claim 15, wherein reading the first digit position of the respective data state of each memory cell of the plurality of memory cells comprises reading each digit position of a plurality of digit positions of the respective data state for each memory cell of the plurality of memory cells, and wherein decoding the read data using the inverse of the function comprises decoding each digit position of the plurality of digit positions of the respective data state for each memory cell of the plurality of memory cells, wherein the plurality of digit positions of the respective data state for each memory cell of the plurality of memory cells comprises the first digit position, the second digit position, the third digit position and the fourth digit position for each memory cell of the plurality of memory cells.

17. The method of claim 16, further comprising ignoring, or deeming invalid, each digit position of the plurality of digit positions of the respective data state for any memory cell of the plurality of memory cells that corresponds to any digit position of the respective data state for that memory cell other than the first digit position of the respective data state for that memory cell.

18. A method of operating a memory, comprising:
  receiving a plurality of digits of data for programming to a plurality of memory cells of the memory during a programming operation, wherein the programming operation is configured to program each memory cell of the plurality of memory cells to a respective data state of a plurality of data states, and wherein each data state of the plurality of data states represents N digits of data with each digit of data of the N digits of data having a corresponding digit position of its data state;
  redistributing the received plurality of digits of data in a reversible manner, thereby generating a plurality of digits of redistributed data, wherein each digit of redistributed data of the plurality of digits of redistributed data corresponds to a respective memory cell of the plurality of memory cells; and
  for each memory cell of the plurality of memory cells, programming the corresponding digit of redistributed data for that memory cell to a first digit position of the respective data state of that memory cell; and
  for each memory cell of the plurality of memory cells, programming N−1 additional digits of data to N−1 additional digit positions of the respective data state of that memory cell;
  wherein the N−1 additional digits of data programmed to any memory cell of the plurality of memory cells have a same data value as the N−1 additional digits of data programmed to each remaining memory cell of the plurality of memory cells; and
  wherein N is an integer value greater than or equal to three.

19. The method of claim 18, wherein each digit of data of the N−1 additional digits of data has a same data value.

20. The method of claim 18, wherein programming the corresponding digit of redistributed data for a particular memory cell to the first digit position of the respective data state of the particular memory cell, and programming the N−1 additional digits of data to the N−1 additional digit positions of the respective data state of the particular memory cell comprises programming the particular memory cell to either a lowest data state of the plurality of data states or a highest data state of the plurality of data states.

* * * * *